US012685143B2

(12) United States Patent
Villalon

(10) Patent No.: US 12,685,143 B2
(45) Date of Patent: Jul. 14, 2026

(54) SEMICONDUCTOR DEVICES INCLUDING AN AIR GAP ADJACENT TO AN INTERCONNECT STRUCTURE AND METHODS OF FORMING THE SAME

(71) Applicant: GlobalFoundries Singapore Pte. Ltd., Singapore (SG)

(72) Inventor: Anthony Jeremy Villalon, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 612 days.

(21) Appl. No.: 18/300,613

(22) Filed: Apr. 14, 2023

(65) Prior Publication Data

US 2024/0347380 A1     Oct. 17, 2024

(51) Int. Cl.
H01L 21/768 (2006.01)
H10W 20/00 (2026.01)
H10W 20/42 (2026.01)
H10W 20/46 (2026.01)

(52) U.S. Cl.
CPC ......... H10W 20/46 (2026.01); H10W 20/056 (2026.01); H10W 20/072 (2026.01); H10W 20/077 (2026.01); H10W 20/081 (2026.01); H10W 20/42 (2026.01)

(58) Field of Classification Search
CPC ........... H01L 21/7682; H01L 21/76802; H01L 21/76834; H01L 21/76877; H01L 23/5226; H01L 23/5222; H01L 23/53295
See application file for complete search history.

(56) References Cited

U.S. PATENT DOCUMENTS

| | | | | |
|---|---|---|---|---|
| 6,359,328 B1* | 3/2002 | Dubin | ................. | H01L 23/5226 |
| | | | | 257/E21.174 |
| 7,094,669 B2* | 8/2006 | Bu | .................... | H01L 21/76807 |
| | | | | 438/319 |
| 8,975,138 B2 | 3/2015 | Chandhok et al. | | |
| 10,892,235 B2* | 1/2021 | Huang | ................. | H01L 23/522 |
| 2005/0074961 A1* | 4/2005 | Beyer | ................... | H01L 21/764 |
| | | | | 257/E21.585 |
| 2005/0230836 A1* | 10/2005 | Clarke | .............. | H01L 23/53295 |
| | | | | 438/619 |
| 2006/0073695 A1* | 4/2006 | Filippi | ................ | H01L 21/7682 |
| | | | | 438/622 |

(Continued)

OTHER PUBLICATIONS

R. Daamen et al., "Multi-Level Air Gap Integration for 32/22nm nodes using a Spin-on Thermal Degradable Polymer and a SiOC CVD Hard Mask," 2007 IEEE International Interconnect Technology Conferencee, Burlingame, CA, USA, 2007, pp. 61-63, doi: 10.1109/IITC.2007.382349.

(Continued)

*Primary Examiner* — Karen Kusumakar
(74) *Attorney, Agent, or Firm* — Francois Pagette

(57) ABSTRACT

A semiconductor device may include a first interlayer dielectric (ILD) over a substrate and a second ILD over the first ILD. An interconnect structure may be in the first ILD and the second ILD. The interconnect structure includes a conductive line on a via portion. An air gap may be arranged below the conductive line and between the via portion and the second ILD. The air gap may be defined by a sidewall of the via portion and a sidewall of the second ILD.

16 Claims, 6 Drawing Sheets

(56)                    References Cited

U.S. PATENT DOCUMENTS

| | | | |
|---|---|---|---|
| 2021/0375665 A1* | 12/2021 | Cheng ............... | H01L 21/76814 |
| 2023/0411489 A1* | 12/2023 | Zhang ................. | H10D 30/601 |

OTHER PUBLICATIONS

H. Warashina et al., "Advanced Air Gap Formation Scheme Using Volatile Material," 2021 IEEE International Interconnect Technology Conference (IITC), Kyoto, Japan, 2021, pp. 1-3, doi: 10.1109/IITC51362.2021.9537549.

N. Nakamura, N. Matsunaga, T. Kaminatsui, K. Watanabe and H. Shibata, "Cost-effective air-gap interconnects by all-in-one post-removing process," 2008 International Interconnect Technology Conference, Burlingame, CA, USA, 2008, pp. 193-195, doi: 10.1109/IITC.2008.4546964.

L. G. Gosset et al., "Multi-Level Cu Interconnects Integration and Characterization with Air Gap as Ultra-Low K Material Formed using a Hybrid Sacrificial Oxide / Polymer Stack," 2007 IEEE International Interconnect Technology Conferencee, Burlingame, CA, USA, 2007, pp. 58-60, doi: 10.1109/IITC.2007.382348.

H.-W. Chen, S.-P. Jeng, H.-Y. Tsai, Y.-W. Liu, C. Yu and Y. Sun, "A Self-Aligned Air Gap Interconnect Process," 2008 International Interconnect Technology Conference, Burlingame, CA, USA, 2008, pp. 34-36, doi: 10.1109/IITC.2008.4546917.

Hoofman, Romano & Bao, T.I. & Daamen, R. & Chen, H.C. & Yang, A. & Orain, S. & Ernur-Badaroglu, D. & Humbert, A. & Shue, S.L. & Yu, C.H.. (2008). Air gaps as a viable alternative for low-k dielectrics in future technology nodes. Advanced Metallization Conference (AMC). 411-417.

J. P. G. de Mussy, C. Bruynsereade, Z. Tokeil, G. P. Beyer and K. Maex, "Novel selective sidewall airgap process [single damascene interconnects]," Proceedings of the IEEE 2005 International Interconnect Technology Conference, 2005., Burlingame, CA, USA, 2005, pp. 150-152, doi: 10.1109/IITC.2005.1499959.

Briber, Robert & Yang, G. & Huang, Emma & Kim, Hyun-Chul & Rice, Philip & Volksen, Willi & Miller, R. & Shin, K.. (2002). Structural Characterization of Nanoporous Pmssq Thin Films. American Physical Society, Annual APS March Meeting, Mar. 18-22, 2002 Indiana Convention Center; Indianapolis, Indiana Meeting ID: Mar. 2, abstract id. Q11.013; BibCode: 2002APS..MARQ11013B.

* cited by examiner

SEMICONDUCTOR DEVICES INCLUDING AN AIR GAP ADJACENT TO AN INTERCONNECT STRUCTURE AND METHODS OF FORMING THE SAME

TECHNICAL FIELD

The present disclosure relates generally to semiconductor devices, and more particularly to an air gap adjacent to an interconnect structure and methods of forming the same.

BACKGROUND

With the decrease in dimensions and feature sizes of semiconductor devices, the density of the elements in the devices are increased. As the distance between adjacent conductive features decreases, this causes issues such as increased cross-talk and capacitive coupling between the conductive features. In some devices an air gap may be integrated in the metallization layer to reduce the resulting cross-talk and capacitive coupling. However, air gaps formed by conventional techniques frequently suffer from misalignment issues during formation and may be challenging to integrate in addition to being prone to defects during subsequent downstream processes. Improved methods of forming airgaps and structures thereof are therefore desired.

SUMMARY

Embodiments generally relate to semiconductor devices and methods of forming thereof. According to various embodiments, a semiconductor device may include a first interlayer dielectric (ILD) over a substrate and a second ILD over the first ILD. An interconnect structure may be in the first ILD and the second ILD. The interconnect structure may include a conductive line on a via portion. An air gap may be arranged below the conductive line and between the via portion and the second ILD. The air gap may be defined by a sidewall of the via portion and a sidewall of the second ILD.

According to another aspect, a semiconductor device may include an ILD over a substrate and an interconnect structure in the ILD. The interconnect structure may include a conductive line on a via portion. An air gap may be arranged around the via portion and below the conductive line, where the air gap may be enclosed by the ILD.

According to various embodiments, a method of forming a semiconductor device is provided. The method may include forming an ILD over a substrate, forming an interconnect structure in the ILD, where the interconnect structure includes a conductive line on a via portion, and forming an air gap around the via portion and below the conductive line. The air gap may be enclosed by the ILD.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Embodiments of the present disclosure generally relate to semiconductor devices having an interconnect structure and an air gap adjacent to the interconnect structure. The interconnect structure and the air gap may be formed in a metallization layer or structure of the devices. For example, the interconnect structure may be a back-end-of-line (BEOL) interconnect. Providing the interconnect structure with the air gap in the metallization structure may advantageously reduce RC delay and improve device performance.

Figure 1A:
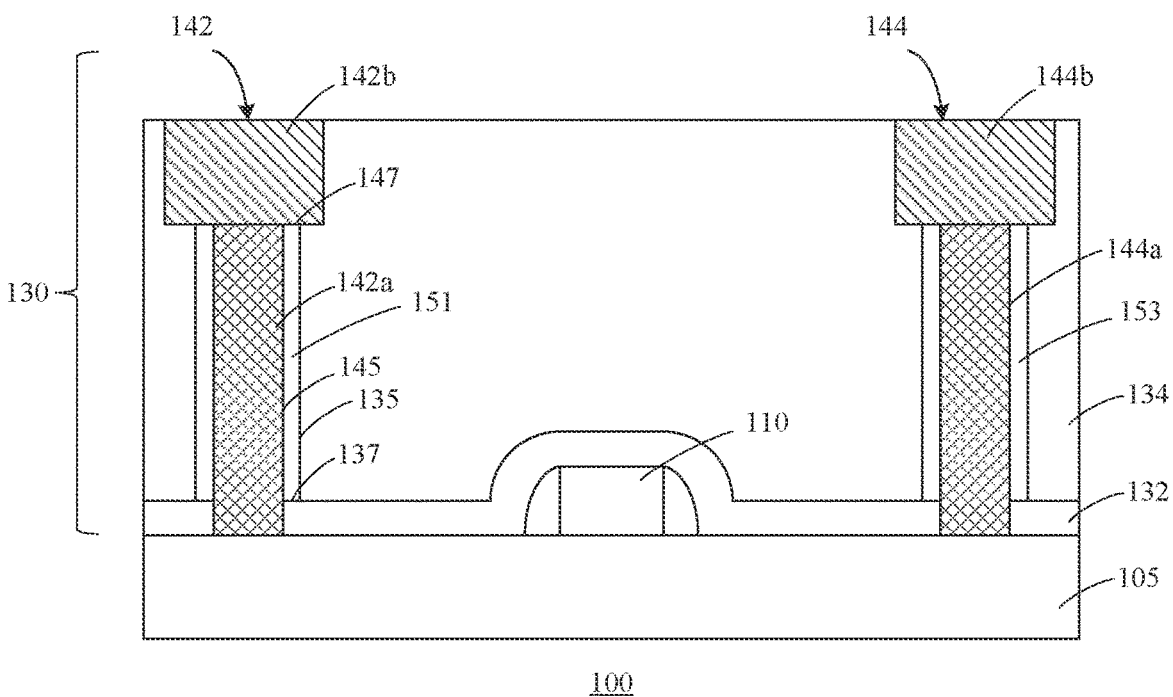
FIG. 1A illustrates a cross-sectional view of an embodiment of a device.

FIG. 1A illustrates a cross-sectional view of an embodiment of a semiconductor device 100. As shown, the device includes a substrate 105. The substrate 105 may be a semiconductor substrate, such as a silicon substrate. Other types of substrates, such as silicon germanium, germanium, gallium arsenide, or crystal-on-insulator (COI) such as silicon-on-insulator (SOI), may also be used. The substrate 105 may include an electronic component 110. For example, the electronic component 110 may be a transistor arranged on the substrate 105. As illustrated in FIG. 1A, a gate electrode of the transistor may be arranged on the substrate 105. The gate electrode may be arranged over a gate dielectric and between source and drain regions of the transistor (not shown). The gate electrode may further include dielectric spacers on sidewalls of the gate electrode and the gate dielectric. Although one electronic component is illustrated, it is understood that there may be a plurality of electronic components and different types of electronic components on the substrate 105.

A wiring or metallization structure 130 may be arranged over the substrate 105. For example, the metallization structure 130 may be formed over the components on the substrate. The metallization structure 130, for example, may be formed by back-end-of-line (BEOL) processing. The metallization structure 130 may include a plurality of inter-layer dielectric (ILD) layers and interconnects disposed in the ILD layers. The ILD layers may be formed of dielectric materials, such as silicon oxide, silicon nitride, low-k dielectric (e.g., SiCOH). The number of ILD layers may depend on, for example, design requirements. The interconnects connect the various components of the semiconductor device or IC to perform the desired functions.

In one embodiment, the metallization structure 130 may include a first ILD layer 132 and a second ILD layer 134. For example, the first ILD layer 132 and the second ILD layer 134 may be in a first metallization level (e.g., contact level, $M_1$) of the metallization structure 130. The first ILD layer 132 may be arranged over the electronic component 110 and the substrate 105. In one embodiment, the first ILD layer 132 may serve as an etch stop layer. The etch stop layer, for example, may be formed of silicon nitride. In other embodiments, the first ILD layer 132 may be formed of silicon oxide. The second ILD layer 134 may be arranged over the first ILD layer 132. The second ILD layer 134 may be partially porous to allow a thermally degradable material of a sacrificial layer occupying a region or space where an air gap 151 is to be formed to evaporate or diffuse through during a thermal treatment at a predetermined temperature. The second ILD layer 134 may be formed of silicon oxide. In some embodiments, the second ILD layer 134 may be formed of a low-k dielectric material. For example, the second ILD layer 134 may be formed of SiCOH. Although only the first ILD layer 132 and the second ILD layer 134 are illustrated, it is understood that the metallization structure 130 may include other ILD layers.

In one embodiment, the metallization structure 130 may include an interconnect structure and an air gap adjacent to the interconnect structure. FIG. 1A illustrates an interconnect structure 142 and an air gap 151. The interconnect structure 142 may include a via portion 142a and a conductive or metal line 142b on the via portion 142a. The via portion 142a and the conductive line 142b may be formed of a conductive material such as copper, copper alloy, aluminum, tungsten or a combination thereof. Other suitable types of metal, alloys or conductive materials may also be useful. In some cases, the via portion 142a and the conductive line 142b may be formed of the same conductive material. In other cases, the via portion 142a and the conductive line 142b may be formed of different conductive materials. In an embodiment where the via portion 142a contacts the substrate 105 (e.g., the interconnect structure 142 is arranged in the first metallization level of the metallization structure 130), the via portion 142a may be formed of tungsten. The conductive line 142b, for example, may also be formed of tungsten. In some embodiments, the via portion 142a and the conductive line 142b may include a conductive barrier layer (not shown) lining sidewalls and a bottom surface of the via portion 142a and the conductive line 142b. The conductive barrier layer, for example, may be formed of tantalum nitride (TaN) or titanium nitride (TiN).

Figure 1B:
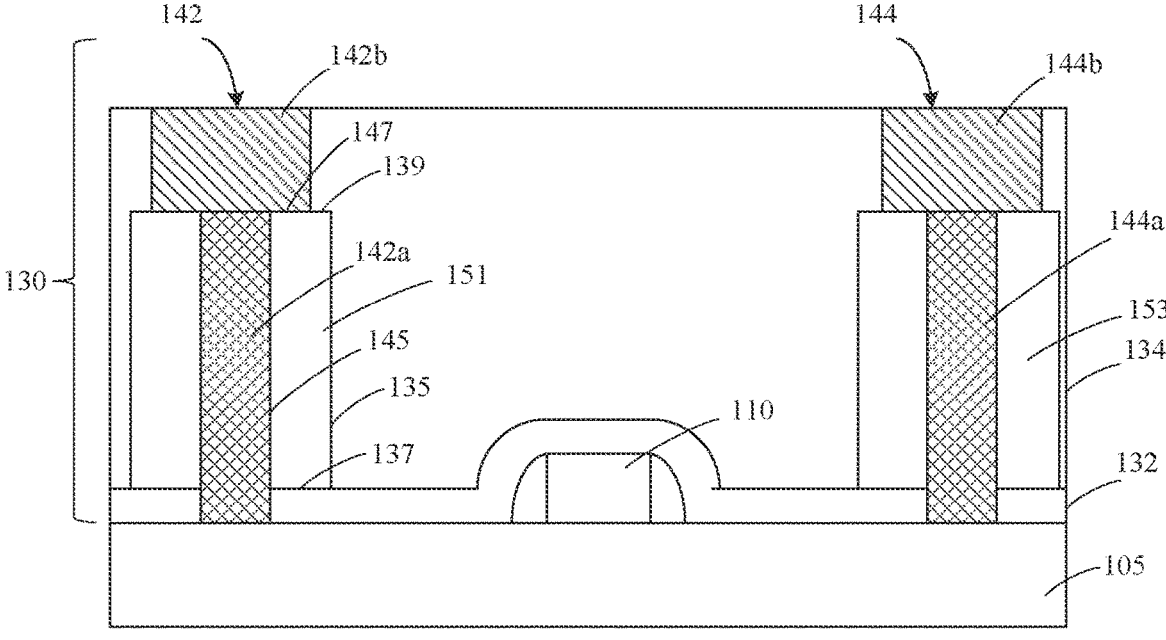
FIG. 1B illustrates a cross-sectional view of another embodiment of the device.

The air gap 151 may be arranged between the via portion 142a and the second ILD layer 134 and below the conductive line 142b. The air gap 151 may be defined by a sidewall 145 of the via portion 142a and a sidewall 135 of the second ILD layer 134. The sidewall 135 of the second ILD layer 134 may be opposite to and facing the sidewall 145 of the via portion 142a. As shown in FIG. 1A and FIG. 1B, the air gap 151 may extend from the sidewall 145 of the via portion 142a to the sidewall 135 of the second ILD layer 134. In some embodiments, the sidewall 135 of the second ILD layer 134 may be substantially parallel to the sidewall 145 of the via portion 142a. Referring to FIG. 1A, the air gap 151 may be further defined by a bottom surface 147 of the conductive line 142b and a top surface 137 of the first ILD layer 132. The bottom surface 147 of the conductive line 142b may be opposite to and facing the top surface 137 of the first ILD layer 132. The air gap 151 may extend from the bottom surface 147 of the conductive line 142b to the top surface 137 of the first ILD layer 132. As illustrated in FIG. 1A, the sidewall 145 of the via portion 142a, the sidewall 135 of the second ILD layer 134, the bottom surface 147 of the conductive line 142b and the top surface 137 of the first ILD layer 132 may interface with the air gap 151. The air gap 151 may be a void, e.g., free of material. As illustrated in FIG. 1A and FIG. 1B, the air gap 151 may be arranged within the second ILD layer 134 and on the first ILD layer 132.

In one embodiment, the air gap 151 may surround the via portion 142a and may be enclosed by the second ILD layer 134. The second ILD layer 134 may enclose the air gap 151 on at least sidewalls 145 of the via portion 142a. The air gap 151 may be further enclosed by the first ILD layer 132. The air gap 151 may separate the via portion 142a from the second ILD layer 134. As illustrated in FIGS. 1A and 1B, the air gap 151 may be arranged on first and second opposing sidewalls 145 of the via portion 142a. In one embodiment, the air gap 151 may have a continuous configuration around the via portion 142a, such as in the form of a continuous ring around the via portion 142a. In this regard, the air gap 151 may completely surround the via portion 142a. For example, the air gap 151 may completely interface the sidewalls 145 of the via portion 142a. The sidewalls 145 of the via portion 142a and a portion of the bottom surface 147 of the conductive line 142b may be exposed to the air gap 151. In other words, the air gap 151 may be in direct contact with the via portion 142a and the conductive line 142b.

In some embodiments, the air gap 151 may further underlap a portion of the second ILD layer 134. Referring to FIG. 1B, the air gap 151 may be further defined by a surface 139 of the second ILD layer 134. The surface 139 of the second ILD layer 134 may be opposite to and facing the top surface 137 of the first ILD layer 132. The air gap 151 may extend from the bottom surface 147 of the conductive line 142b and the surface 139 of the second ILD layer 134 to the top surface 137 of the first ILD layer 132. In one embodiment, the bottom surface 147 of the conductive line 142b and the surface 139 of the second ILD layer 134 may be substantially coplanar.

In one embodiment, the sidewall 135 of the second ILD layer 134 may be substantially vertical with respect to a top surface of the substrate 105 which the second ILD layer 134 is formed over. For example, the substantially vertical sidewall 135 may be obtained or formed by etching the thermally degradable material of the sacrificial layer occupying a region where the air gap 151 is to be formed.

The sidewall 135 of the second ILD layer 134 may adjoin the top surface 137 of the first ILD layer 132 to form a first corner of the air gap. For example, the corner may be a tip or pointed end, i.e., not rounded. In one embodiment, the sidewall 135 of the second ILD layer 134 may further adjoin the bottom surface 147 of the conductive line 142b to form a second corner of the air gap. In other embodiments, the sidewall 135 of the second ILD layer 134 may further adjoin the surface 139 of the second ILD layer 134 to define a second corner of the air gap. For example, the first and/or second corners may have an angle of about 90° (e.g., right angle).

In some embodiments, the interconnect structure 142 and the air gap 151 may be arranged laterally adjacent to the electronic component 110. For example, in the case the electronic component 110 is a transistor, the interconnect structure 142 and the air gap 151 may be laterally spaced apart from sidewalls of the gate electrode of the transistor.

In some embodiments, the electronic component 110 may be arranged between the interconnect structure 142 and a second interconnect structure 144. A second air gap 153 may be arranged adjacent to the second interconnect structure 144. The second interconnect structure 144 may include a via portion 144a and a conductive line 144b on the via portion 144a. The second air gap 153 may be arranged between the via portion 144a and the second ILD layer 134 and below the conductive line 144b.

In one embodiment, the via portions 142a and 144a may extend through the first ILD layer 132. For example, the via portions 142a and 144a may extend through the first ILD layer 132 to contact the substrate 105. For example, the via portions 142a and 144a may contact the source and drain regions of the transistor in the substrate 105 (not shown).

In other embodiments, the via portions 142a and 144a and the respective air gaps 151 and 153 may be arranged in between metallization levels, such as between $M_{x-1}$ and $M_x$. In some embodiments, there may be a plurality of via portions 142a below the conductive line 142b (not shown). For example, each of the plurality of via portions 142a may be formed with a respective air gap adjacent to the via portion 142a. Similarly, there may be a plurality of via portions 144a below the conductive line 144b of the second interconnect structure (not shown). For example, each of the plurality of via portions 144a may be formed with a respective air gap adjacent to the via portion 144a.

According to various embodiments, providing the interconnect structures and the air gaps in the ILD may lower or reduce the capacitance in the metallization structure of the device. For example, the reduced capacitance in the metallization structure may improve RF device performance. Further, the air gaps may be integrated in metallization structures with interconnects having small and/or large pitch dimensions (e.g., dense and/or isolated via portions).

FIGS. 2A-2J show cross-sectional views of a process for forming a semiconductor device. The device, for example, is similar to that described in FIGS. 1A-1B. As such, common elements may not be described or described in detail.

Figure 2A:
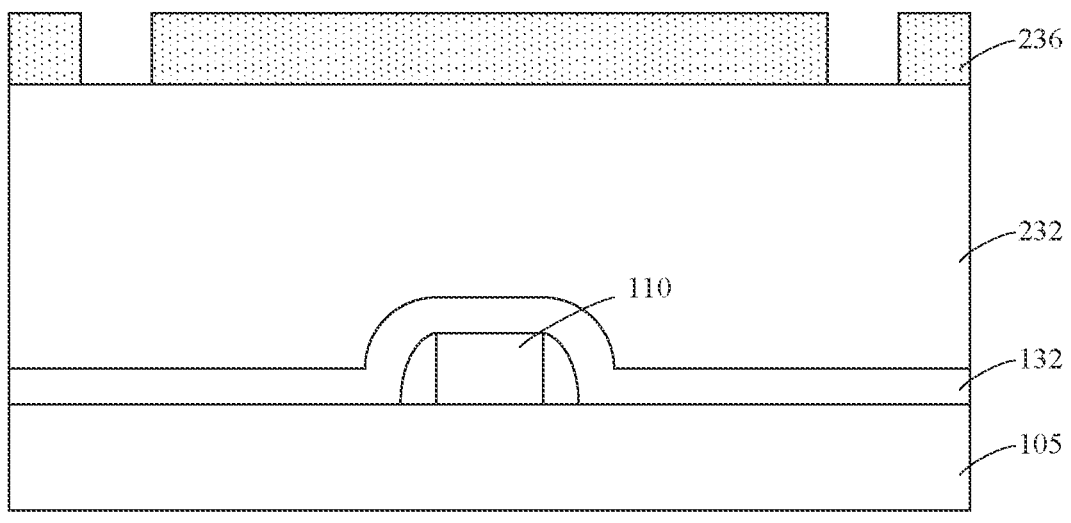
FIGS. 2A-2J show cross-sectional views illustrating a process for forming a device.

Referring to FIG. 2A, a substrate 105 is provided. The substrate 105 may be a semiconductor substrate, such as a silicon substrate in a non-limiting embodiment. The substrate may be at least partially processed. The substrate, as shown, is at the stage of processing where the electronic component(s) 110 and at least a portion of the metallization structure has been formed over the substrate 105 in a BEOL processing. For example, the first ILD layer 132 has been formed over the substrate 105. As illustrated, an intermediate dielectric layer 232 may be formed over the first ILD layer 132. The first ILD layer 132 may serve as an etch stop layer and may be formed, for example, from silicon nitride. The intermediate dielectric layer 232, for example, may be formed of a dielectric material such as silicon oxide. The first ILD layer 132 and the intermediate dielectric layer 232 may be formed by chemical vapor deposition (CVD).

A sacrificial via corresponding to a via portion of each interconnect structure to be formed with an air gap may be formed in the first ILD layer 132 and the intermediate dielectric layer 232. For example, via openings may be formed in the first ILD layer 132 and the intermediate dielectric layer 232 by mask and etch techniques. For example, a patterned mask 236 such as a photoresist layer may be formed over the intermediate dielectric layer 232 to correspond to locations where the via openings are to be formed. For example, a photoresist may be patterned by exposing it with an exposure source using a reticle with the desired pattern. After exposure, the photoresist may be developed, transferring the pattern of the reticle to the photoresist. The patterned photoresist may then be used as an etch mask to remove the dielectric material of the first ILD layer 132 and the intermediate dielectric layer 232 to form the via openings. The patterned mask 236 may be removed, for example, by ashing in the case of a photoresist layer, after forming the via openings.

Figure 2B:
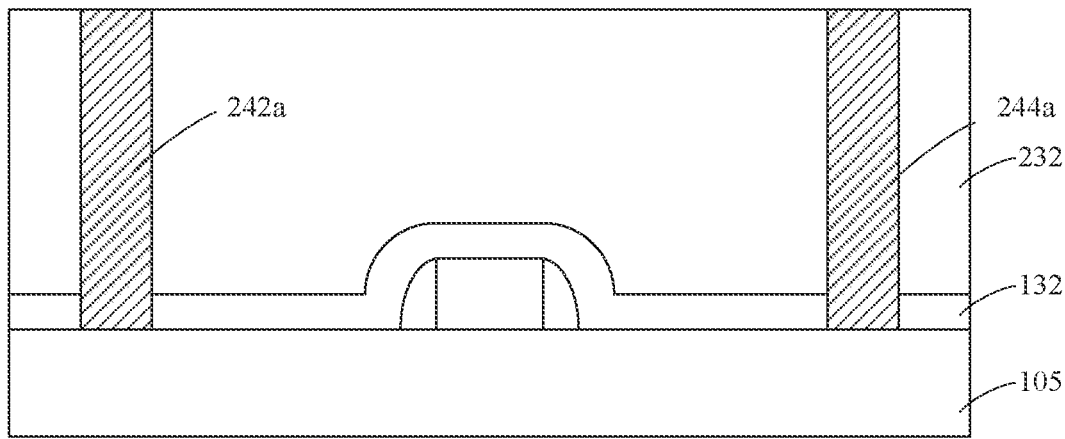

After the via openings are formed, a material for the sacrificial vias, such as polysilicon for example, may be deposited to fill the via openings. Polysilicon may be formed by, for example, low pressure chemical vapor deposition (LPCVD) to form the sacrificial vias. Other types of material for the sacrificial vias or forming techniques may also be useful. A planarization process, such as chemical mechanical polishing (CMP), may be performed to remove excess material external to the via openings, forming the sacrificial vias 242a and 244a in the first ILD layer 132 and the intermediate dielectric layer 232, as illustrated in FIG. 2B. Although two sacrificial vias are shown, it is understood that there can be any number of sacrificial vias depending on the number of via portions to be formed with air gaps.

The intermediate dielectric layer 232 may then be removed, for example using a reactive ion etch (RIE). A sacrificial layer may be formed on the sidewalls of the sacrificial vias 242a and 244a for occupying the region or space where the air gaps are to be formed.

Figure 2C:
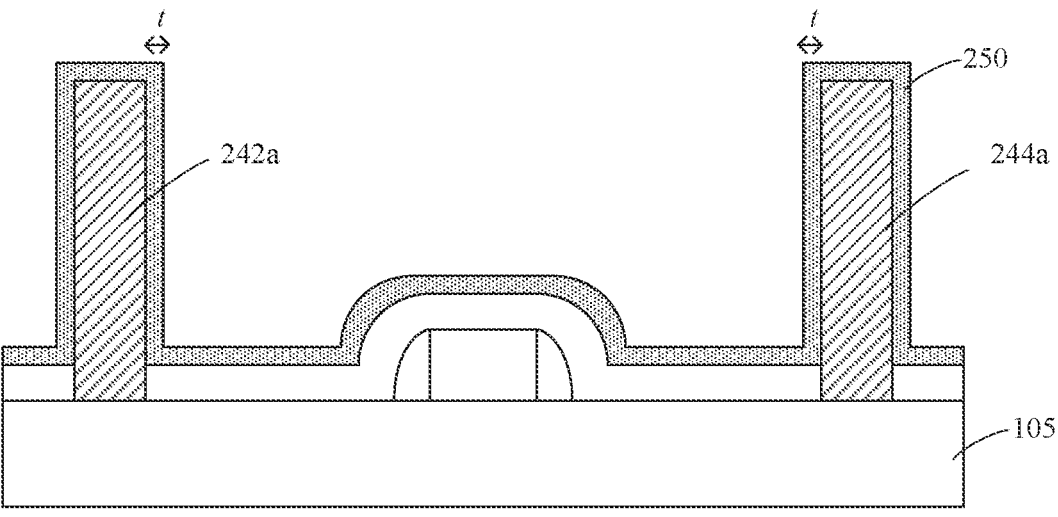

Referring to FIG. 2C, a layer of thermally degradable (or decomposable) material 250 may be deposited over the substrate 105 and the sacrificial vias 242a and 244a. The layer of thermally degradable material 250 may be conformal to the sacrificial vias 242a and 244a. For example, the layer of thermally degradable material 250 may conformally cover and line the sidewalls and top surfaces of the sacrificial vias 242a and 244a. The layer of thermally degradable material 250 may be deposited to a predefined thickness, t, on the sidewalls of the sacrificial vias 242a and 244a which corresponds to a predefined width of the subsequently formed air gaps. For example, FIG. 2C illustrates the layer of thermally degradable material 250 with a thickness, t, on the sidewalls of the sacrificial vias 242a and 244a which corresponds to a width of the air gaps 151 and 153 shown in FIG. 1A. In other embodiments, the layer of thermally degradable material 250 may be formed with a thickness, t, on the sidewalls of the sacrificial vias 242a and 244a which corresponds to a width of the air gaps 151 and 153 shown in FIG. 1B. For example, the air gaps 151 and 153 may have a width such that the air gaps 151 and 153 extend under a portion of the second ILD layer 134.

The thermally degradable material may decompose at a predetermined temperature without decomposition or substantial decomposition of surrounding structures such as the subsequently formed interconnect structures and dielectric material of the metallization structure (e.g., the first and second ILD layers). For example, the thermally degradable material may be a polymer which may decompose at the predetermined temperature. The predetermined temperature may be a decomposition temperature of the thermally degradable material and may be lower than the decomposition or degradation temperatures of the interconnect structures and the ILD layers. The thermally degradable material may fully decompose and evaporate or diffuse through the subsequently formed second ILD layer 134 at the predetermined temperature, leaving behind a void in the region previously occupied by the thermally degradable material. The predetermined temperature, for example, may range from about 400° C. to about 450° C. In one embodiment, the thermally degradable material may be a porogen polymer such as alpha-terpinene porogen in a non-limiting example, and the predetermined temperature, for example, may be about 400° C. or higher. The layer of thermally degradable material 250 may be formed by depositing the thermally degradable material using plasma enhanced CVD.

Figure 2D:
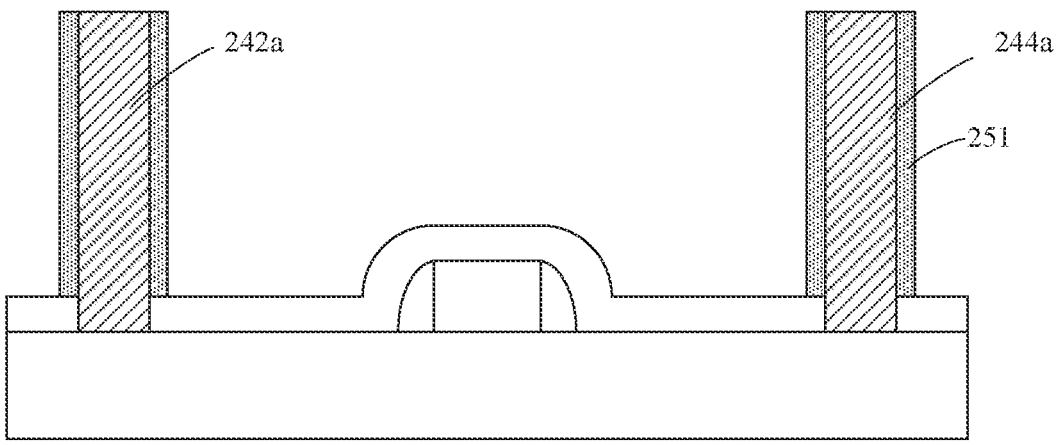

In one embodiment, portions (e.g., horizontal portions) of the layer of thermally degradable material 250 may be removed such that the portions (e.g., vertical portions) 251 lining the sidewalls of the sacrificial vias 242a and 244a remain, as illustrated in FIG. 2D. In other words, the layer of thermally degradable material 250 may be removed except for portions lining the sidewalls of the sacrificial vias 242a and 244a, leaving the sacrificial spacer or layer 251 on the sidewalls of the sacrificial vias 242a and 244a. The portions of the layer of thermally degradable material 250 may be removed, for example, by a reactive ion etch (RIE). The sacrificial layer 251 on the sidewalls the sacrificial vias 242a and 244a may have a planar side surface.

Figure 2E:
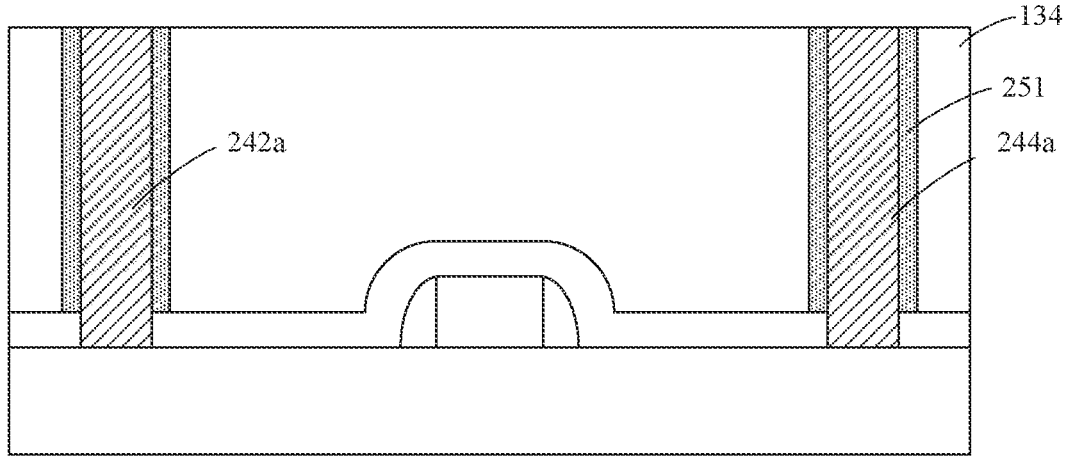

Referring to FIG. 2E, a dielectric material may be deposited over the substrate 105 and the sacrificial vias 242a and 244a to form a first portion or level of the second ILD layer 134. A planarization process, such as CMP, may be performed to expose a top surface of the sacrificial vias 242a and 244a. A top surface of the first level of the second ILD layer 134 and a top surface the sacrificial layer 251 lining the sidewalls of the sacrificial vias 242a and 244a may be substantially coplanar.

Figure 2F:
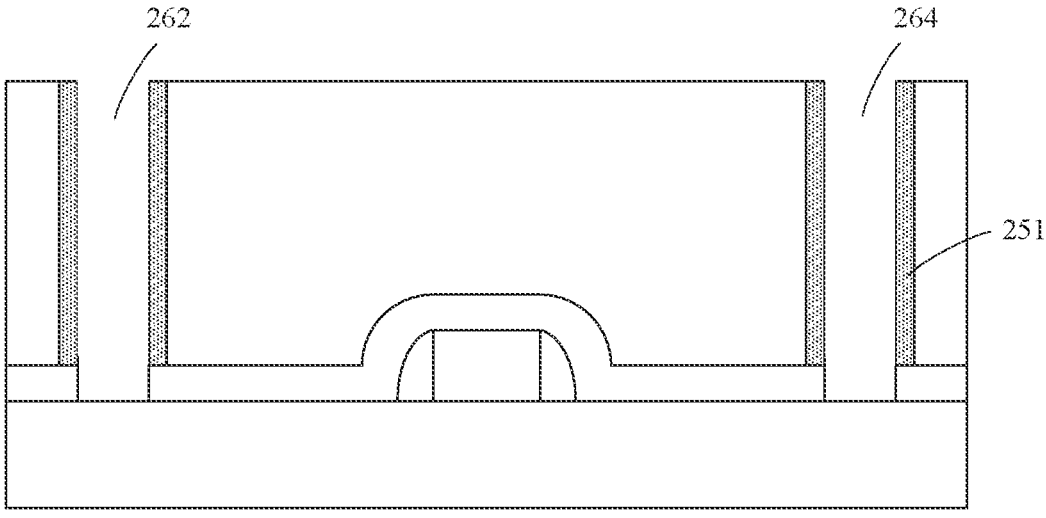

The sacrificial vias 242a and 244a may be replaced with via portions of the interconnect structures to be formed. Referring to FIG. 2F, the sacrificial vias 242a and 244a may be removed, leaving via openings 262 and 264 in the first level of the second ILD layer 134. For example, the sacrificial vias 242a and 244a may be removed using an RIE.

Figure 2G:
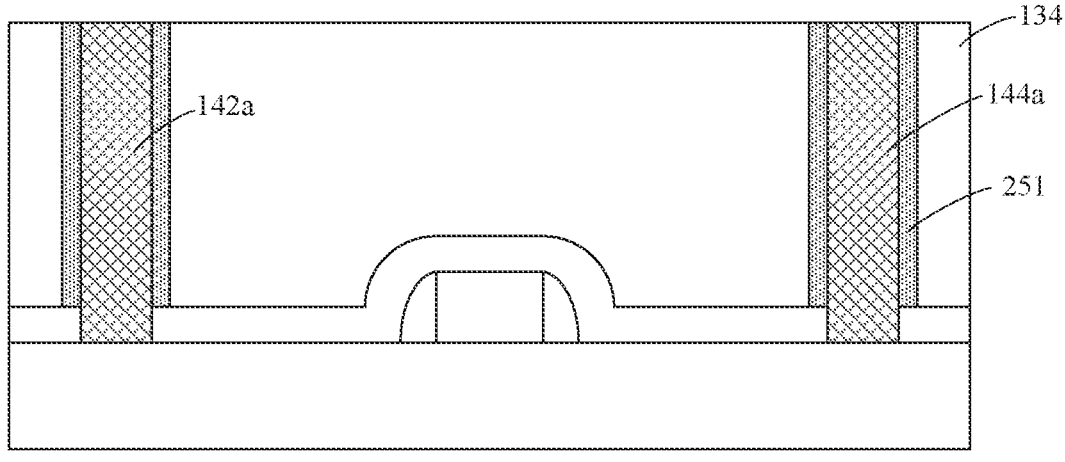

As shown in FIG. 2G, the via portions 142a and 144a of the interconnect structures may be formed in the via openings 262 and 264. For example, the via portions 142a and 144a may be formed by lining the via openings 262 and 264 with a conductive barrier layer and filling the via openings 262 and 264 with a conductive material. A planarization process, such as CMP, may be performed to provide a substantially planar top surface between the via portions 142a and 144a and the first level of the second ILD layer 134.

Figure 2H:
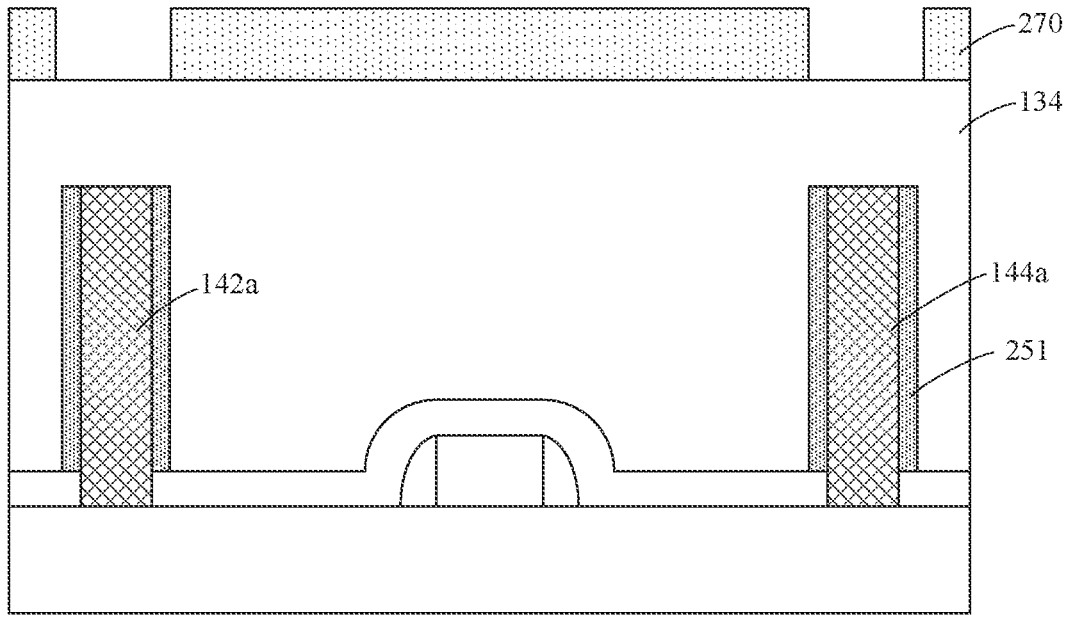
Figures 2I, 2J:
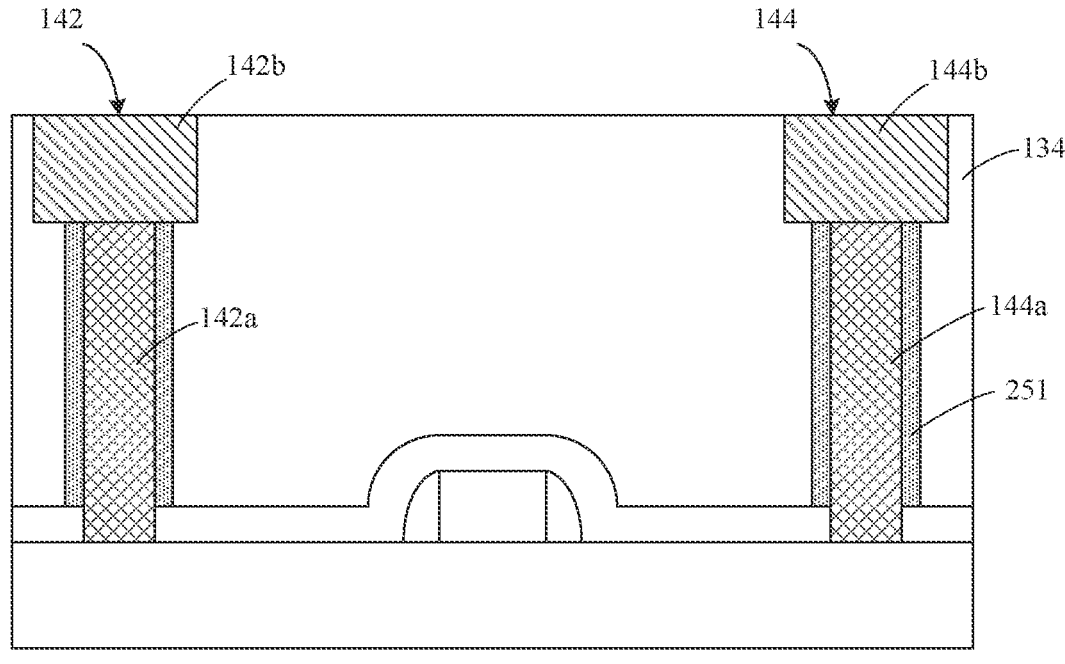

Conductive lines may be formed on the via portions 142a and 144a. For example, further dielectric material may be deposited over the substrate 105 and the via portions 142a and 144a to form a second level of the second ILD layer 134. Trenches for the conductive lines may be formed in the second level of the second ILD layer 134, for example, by mask and etch techniques. Referring to FIG. 2H, a patterned mask 270 such as a photoresist layer may be formed over the second ILD layer 134 to correspond to locations where the trenches are to be formed. For example, a photoresist may be patterned by exposing it with an exposure source using a reticle with the desired pattern. After exposure, the photoresist may be developed, transferring the pattern of the reticle to the photoresist. The patterned photoresist may then be used as an etch mask to remove the dielectric material of the second level of the second ILD layer 134 above the via portions 142a and 144a. The patterned mask 270 may be removed, for example, by ashing in the case of a photoresist layer, after forming the trenches. For example, a conductive barrier layer and a conductive material may be formed in the trenches to form the conductive lines 142b and 144b, as illustrated in FIG. 2I. For example, the conductive barrier layer may be formed to line the trenches and the conductive material may be deposited to fill the trenches, for example by CVD. A planarization process, such as CMP, may be performed to remove excess conductive material. The planarization process may provide a substantially planar top surface between the conductive lines 142b and 144b and the second ILD layer 134, as illustrated in FIG. 2I. The first level of the second ILD layer 134 may be a via level, while the second level of the second ILD layer 134 may be a metal or line level.

A self-aligned air gap may be formed for each of the interconnect structures 142 and 144. The air gaps may be formed without using a mask. The sacrificial layer 251 may be removed, leaving behind the air gaps 151 and 153 around the via portions 142a and 144a, respectively. For example, for each of the interconnect structures 142 and 144, a sidewall of the via portion and a sidewall of the second ILD layer 134 as well as the bottom surface of the conductive line and a top surface of the first ILD layer 132 may define the air gap. For example, the sidewall of the via portion and the sidewall of the second ILD layer 134 as well as the bottom surface of the conductive line and the top surface of the first ILD layer 132 may form a channel filled by the air gap. The sacrificial layer 251 may be removed by decomposing the thermally degradable material of the sacrificial layer 251 using a thermal treatment. For example, the thermal treatment may be at a temperature of about 400° C. or higher and for a duration of about 10 minutes to about 2 hours. For example, a higher temperature may require a shorter duration to decompose the thermally degradable material while a lower temperature may require a longer duration. The thermally degradable material, such as a thermally degradable polymer, may decompose to gas and evaporate or diffuse through the second ILD layer 134. In one embodiment, the thermal treatment completely decomposes the sacrificial layer 251, leaving a void in the region previously occupied by the sacrificial layer 251, forming the air gaps 151 and 153 adjacent to the via portions 142a and 144a, respectively. In such cases, no thermally degradable material remains in the first and second dielectric layers 132 and 134. In some cases, residue of the thermally degradable material (e.g., polymer) may be located at the interface between the air gap 151 and the second ILD layer 134 and/or at the interface between the air gap 151 and the interconnect structure (e.g., via portion 142a and/or conductive line 142b).

Additional processes may be performed to complete fabrication of the device. Such processes may include forming additional interconnect levels, final passivation, dicing, packaging, testing, etc.

Accordingly, various embodiments provide a method of forming an air gap with controllable width adjacent to an interconnect structure. The width of the air gap may be controlled by adjusting the thickness of the sacrificial layer formed on the sidewalls of the sacrificial vias during processing. Further, the air gap may be formed independent of the density or pitch of the interconnect structures (e.g., via portions and/or conductive lines). In other words, the formation of the air gap is not limited by the density or pitch of the interconnect structures. Accordingly, the air gap may be formed between isolated and/or dense via portions. Additionally, the air gap may be formed without using an additional mask during the processing of the ILD, i.e., self-aligned air gap.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A semiconductor device comprising:
a first interlayer dielectric (ILD) over a substrate and a second ILD over the first ILD;
an interconnect structure in the first ILD and the second ILD, wherein the interconnect structure comprises a conductive line on a via portion; and
an air gap arranged below the conductive line and between the via portion and the second ILD, wherein the air gap is defined by a sidewall of the via portion and a sidewall of the second ILD, and a bottom surface of the conductive line and a top surface of the first ILD, wherein the air gap further underlaps a portion of the second ILD, and the air gap is further defined by a surface of the second ILD opposite to the top surface of the first ILD.

2. The device of claim 1, wherein the air gap extends from the sidewall of the via portion to the sidewall of the second ILD and from the bottom surface of the conductive line to the top surface of the first ILD.

3. The device of claim 1, wherein the bottom surface of the conductive line and the surface of the second ILD are substantially coplanar.

4. The device of claim 1, wherein the air gap completely surrounds the via portion.

5. The device of claim 1, wherein the sidewall of the second ILD is substantially parallel to the sidewall of the via portion.

6. The device of claim 1, wherein the air gap is arranged within the second ILD and on the first ILD.

7. The device of claim 6, wherein the via portion extends through the first ILD.

8. The device of claim 1, further comprising an electronic component on the substrate, wherein the interconnect structure and the air gap is arranged laterally adjacent to the electronic component.

9. The device of claim 8, further comprising a second interconnect structure and a second air gap adjacent to the second interconnect structure, wherein the electronic component is arranged between the interconnect structure and the second interconnect structure.

10. A semiconductor device comprising:
an interlayer dielectric (ILD) over a substrate;
an interconnect structure in the ILD, wherein the interconnect structure comprises a conductive line on a via portion; and
an air gap arranged around the via portion and below the conductive line, wherein the air gap is enclosed by the ILD, wherein the air gap underlaps a portion of the ILD, and a bottom surface of the conductive line and a surface of the ILD are substantially coplanar.

11. The device of claim 10, wherein sidewalls of the via portion and a portion of the bottom surface of the conductive line is exposed to the air gap.

12. A method of forming a semiconductor device, comprising:
forming an interlayer dielectric (ILD) over a substrate, wherein the ILD is formed over a second ILD over the substrate;
forming an interconnect structure in the ILD, wherein the interconnect structure comprises a conductive line on a via portion; and
forming an air gap around the via portion and below the conductive line, wherein the air gap is enclosed by the ILD and the second ILD, the air gap is defined by a sidewall of the via portion and a sidewall of the ILD, and a bottom surface of the conductive line and a top surface of the second ILD, wherein the air gap further underlaps a portion of the ILD, and the air gap is further defined by a surface of the ILD opposite to the top surface of the second ILD.

13. The method of claim 12, wherein the bottom surface of the conductive line and the surface of the ILD are substantially coplanar.

14. The method of claim 12, wherein forming the interconnect structure comprises:
forming a sacrificial via over the substrate;
forming a sacrificial layer on sidewalls of the sacrificial via;
replacing the sacrificial via with the via portion of the interconnect; and
forming the conductive line over the via portion and the sacrificial layer.

15. The method of claim 14, wherein forming the air gap comprises removing the sacrificial layer from the ILD, leaving a void in a region previously occupied by the sacrificial layer.

16. The method of claim 15, wherein the sacrificial layer comprises a thermally degradable material, and removing the sacrificial layer comprises performing a thermal treatment at a predetermined temperature to decompose the thermally degradable material.

* * * * *